United States Patent [19]

Engelking et al.

[11] Patent Number: 5,489,106
[45] Date of Patent: Feb. 6, 1996

[54] CLEAN ROOM CART

[75] Inventors: Steven Engelking; Carol Magallanez, both of San Antonio, Tex.

[73] Assignees: Sony Corporation, Tokyo, Japan; Sony Electronic Inc., Park Ridge, N.J.

[21] Appl. No.: 214,869

[22] Filed: Mar. 16, 1994

[51] Int. Cl.⁶ ........................................ B62B 3/10
[52] U.S. Cl. .................... 280/47.35; 280/79.11; 312/109; 312/290; D3/298; D34/20
[58] Field of Search .............. 280/47.35, 47.34, 280/79.11, 79.2, 47.371, 47.19; 312/109, 117, 119, 122, 126, 131, 132, 290, 330.1; 296/22; 16/90, 96 R, 87 B; D3/298; D34/19, 20, 17, 21

[56] References Cited

U.S. PATENT DOCUMENTS

| | | | |
|---|---|---|---|
| D. 5,087 | 7/1871 | Seldis | D3/298 |
| D. 239,490 | 4/1976 | Pellegrini | D34/20 |
| D. 291,037 | 7/1987 | Handler | D34/19 |
| 1,259,167 | 3/1918 | Ticheli | 312/119 |
| 1,764,612 | 6/1930 | Dickinson | 312/290 |
| 2,430,635 | 11/1947 | Glass | 312/119 |
| 2,778,704 | 1/1957 | Joachim | 312/290 |
| 4,108,515 | 8/1978 | Johnson | 312/126 |
| 5,205,630 | 4/1993 | Welch et al. | 312/330.1 |
| 5,306,028 | 4/1994 | Pike | 280/47.371 |

FOREIGN PATENT DOCUMENTS 1261727  4/1961  France ................... 312/126

*Primary Examiner*—Ann Marie Boehler
*Attorney, Agent, or Firm*—Pasquale Musacchio; Jerry A. Miller

[57] ABSTRACT

A cart for maintaining items, which are used in a cleanroom, at a predetermined cleanliness level. The cart includes a cabinet having an internal cavity and opposed first and second internal walls. The cart further includes a shelf affixed horizontally within the cavity to form top and lower compartments within the cabinet. In addition, a lower horizontal track is affixed to the cabinet above the top compartment. A lower door is slidably affixed within the lower track. Additionally, the cart includes an upper horizontal track affixed to the cabinet above the lower track and an upper door slidably affixed within the upper track, wherein the upper and lower doors are movable in a horizontal direction above the top compartment. The top compartment is substantially isolated from contamination when the upper door contacts the first wall and the lower door contacts the second wall or when the upper door contacts the second wall and the lower door contacts the first wall.

2 Claims, 6 Drawing Sheets

5,489,106

CLEAN ROOM CART

FIELD OF THE INVENTION

This invention relates to the manufacture of integrated circuits (ICs), and more particularly, to a clean room cart which maintains catch cups at a level of cleanliness sufficient for IC manufacturing.

BACKGROUND OF THE INVENTION

An integrated circuit is typically manufactured by a process which utilizes planar technology. Generally, this process includes growing a layer of silicon dioxide on a silicon wafer. In addition, a photosensitive coating, or photoresist, is formed on the silicon dioxide layer. Ultraviolet light is then utilized to polymerize and harden predetermined areas of the photoresist. Areas of the photoresist not subjected to ultraviolet light are dissolved and removed, thus forming a photoresist mask on the silicon dioxide layer and leaving an exposed silicon dioxide surface in the shape of a desired circuit pattern. The exposed silicon dioxide layer surface is then subjected to hydrofluoric acid which removes the exposed silicon dioxide layer and exposes the underlying silicon wafer. Dopants are then diffused into the exposed silicon wafer which are ultimately used to form the desired circuit.

A photoresist coater apparatus is used to form the photoresist layer. Essentially, the photoresist coater is adapted to spin a silicon wafer inside of an associated cup element known as a "catch cup" while photoresist is applied to the silicon dioxide layer on the silicon wafer. Centrifugal force produced by spinning the silicon wafer spreads the photoresist and forms a relatively thin layer of photoresist on the silicon dioxide layer. Each catch cup serves to collect excess photoresist that is spun off of the silicon dioxide layer by the centrifugal force.

The performance of an IC or other similar electronic device is substantially degraded by particulate and other contamination. As such, many of the processes used for manufacturing an IC, such as coating the silicon dioxide layer with photoresist, are performed in a clean room having a filtration system. The filtration system serves to remove particles and other contamination from the cleanroom to provide a level of cleanliness suitable for manufacturing an IC. In addition, it is desirable that items used in the manufacture of ICs, such as catch cups, are also maintained at least at the same level of cleanliness as the device being manufactured in order that such items do not contaminate the device.

Typically, the catch cups are periodically removed from the photoresist coater in order to clean excess photoresist from the catch cups. In many manufacturing facilities, the catch cups are cleaned in a workroom which serves as a general purpose cleaning area where various other items in the facility are also cleaned. Consequently, substantial amounts of particulates and other contamination are generated in such workrooms. In addition, such workrooms typically do not include a filtration system or other similar equipment for removing such contamination.

An open cart is often used to transport the catch cups between the cleanroom and the workroom. Typically, the catch cups are placed on a shelf of the cart such that they are exposed to the surrounding environment. As such, the catch cups are subject to substantial amounts of contamination after they have been cleaned in the workroom. In addition, the catch cups are subject to further contamination by particles which have not been removed by the filtration system in the cleanroom. Still further contamination may result if a contaminated tool or other item is placed on the open cart near the catch cups. Consequently, the catch cups may be in a substantially contaminated condition before they are re-installed into the photoresist coater.

A substantial amount of turbulent air flow is generated by each silicon wafer as it spins within its associated catch cup during application of the photoresist layer. This air flow displaces particles and other contamination from its associated catch cup. Frequently, this contamination undesirably contaminates the photoresist, silicon wafer or both, ultimately resulting in an IC device having substantially degraded performance.

Furthermore, it is noted that photoresist emits odors which are offensive to many operators. As such, operators who transport catch cups contaminated with photoresist on the cart must frequently stop in order to seek relief from the odors, thus resulting in lost productivity. Consequently, there is a need in the art for a clean room cart which maintains the catch cups at a cleanliness level sufficient for IC manufacturing and which substantially reduces an operator's exposure to odors emitted by photoresist in the catch cups.

SUMMARY OF THE INVENTION

The present invention relates to a cart for maintaining items, which are used in a cleanroom, at a predetermined cleanliness level. The cart includes a cabinet having an internal cavity and opposed first and second internal walls. The cart further includes a shelf affixed horizontally within the cavity to form top and lower compartments within the cabinet. In addition, a lower horizontal track is affixed to the cabinet above the top compartment. A lower door is slidably affixed within the lower track. Additionally, the cart includes an upper horizontal track affixed to the cabinet above the lower track and an upper door slidably affixed within the upper track, wherein the upper and lower doors are movable in a horizontal direction above the top compartment. The top compartment is substantially isolated from contamination when the upper door contacts the first wall and the lower door contacts the second wall or when the upper door contacts the second wall and the lower door contacts the first wall.

DETAILED DESCRIPTION OF THE INVENTION

The performance of an IC or other similar electronic device is substantially degraded by particulate and other contamination. As such, many of the processes used for manufacturing an IC are performed in a clean room having a filtration system. The filtration system serves to remove particles and other contamination from the cleanroom to provide a level of cleanliness suitable for manufacturing an IC.

It is desirable that items used in the manufacture of ICs are maintained at least at the same level of cleanliness as the device being manufactured in order that such items do not contaminate the device. One such item is known as a "catch cup", which is used in photoresist coater apparatus.

Figure 1:
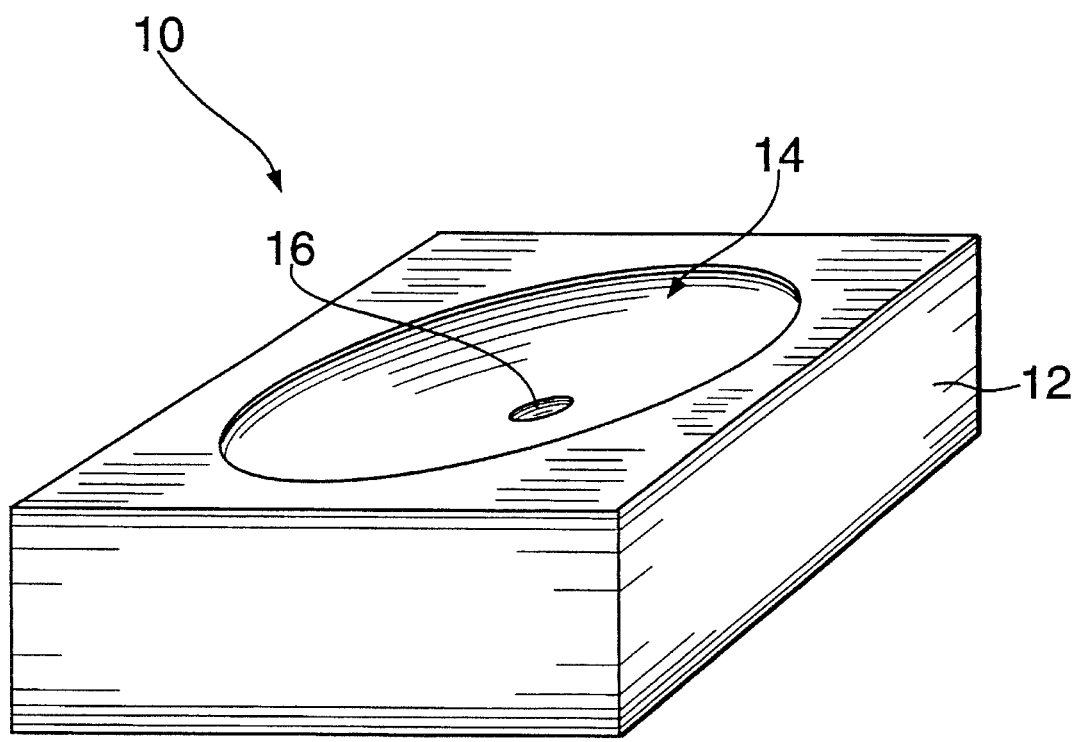
FIG. 1 is a view of a catch cup.

Referring to FIG. 1, a catch cup 10 is shown. The catch cup 10 includes a substantially square shaped body 12 having a cavity 14 for accommodating a silicon wafer (not shown). The cavity 14 includes an aperture 16 for receiving a spindle connected to a photoresist coater (not shown). The spindle is adapted to spin the silicon wafer in order to remove excess photoresist. The excess photoresist is collected by the cavity 14. In addition, the cavity 14 includes a drain hole 16 for draining of excess photoresist. Furthermore, the catch cup 10 is shaped to enable stacking with other catch cups in order to facilitate storage.

In accordance with the present invention, a clean room cart is described which maintains catch cups at a cleanliness level sufficient for IC manufacturing. The present invention will now be explained by referring to following description in conjunction with the following figures, wherein like reference numerals depict like elements.

Figure 2:
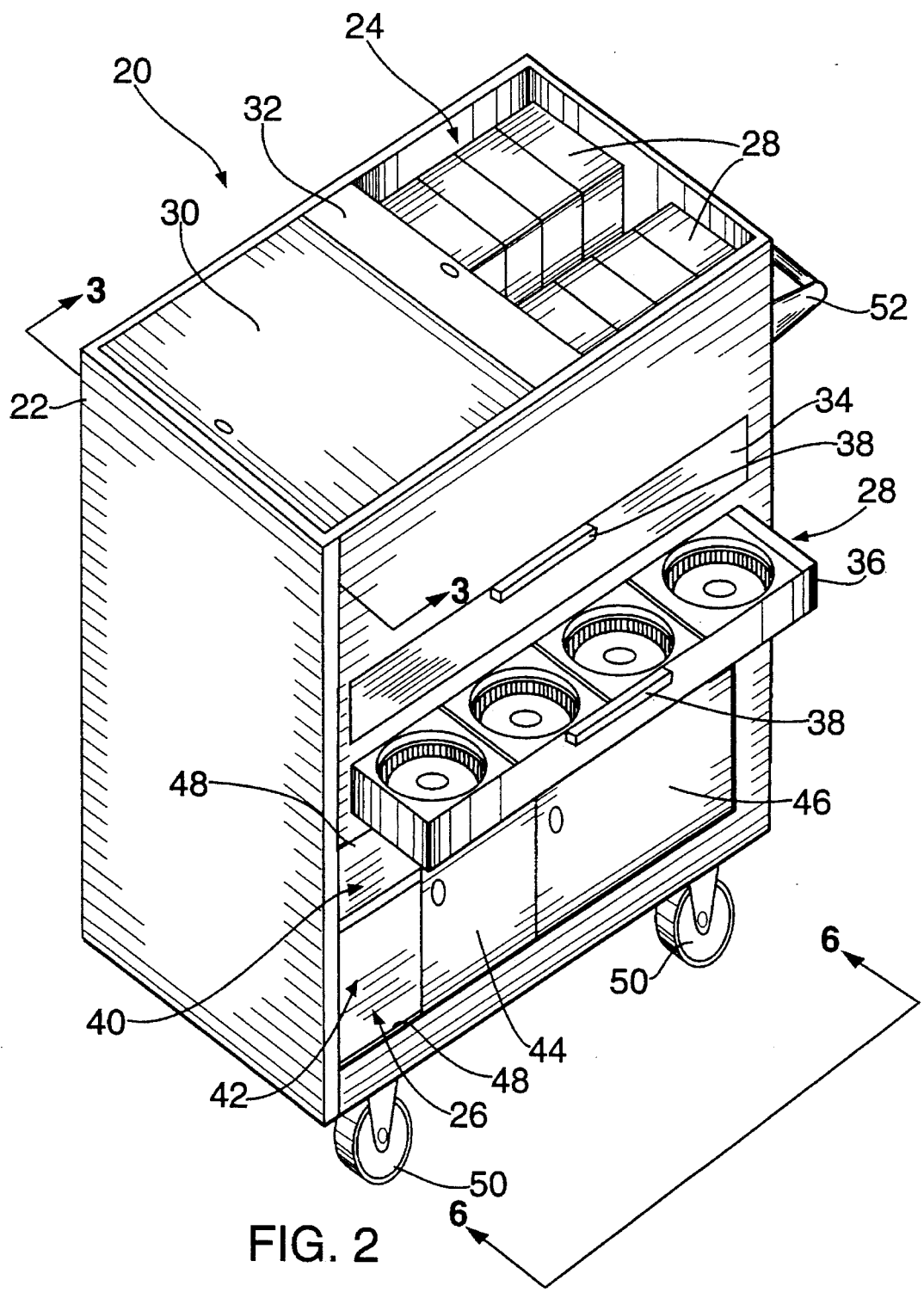
FIG. 2 is a view of the cart in accordance with the present invention.

Referring to FIG. 2, a clean room cart 20 in accordance with the present invention is shown. The cart 20 includes a substantially rectangular cabinet 22 having a top compartment 24 and a side opening 26. The top compartment 24 is sized to accomodate horizontally stacked catch cups 28 which are cleaned and are to be used in a photoresist coating process. Upper 30 and lower 32 sliding doors are slidably affixed over the top compartment 24 and thus the catch cups 28. The upper 30 and lower 32 doors serve to protect the catch cups 28 from contamination when both doors 30,32 are in a closed position. In addition, either door 30,32 may be opened to provide access to the catch cups 28. In FIG. 2, the lower door 32 is shown in a partially opened position.

The cabinet 22 further includes top 34 and bottom 36 drawers slidably positioned within the cabinet 22. The top 34 and bottom 36 drawers are each adapted to store catch cups 28 which have been contaminated with excess photoresist. Each drawer 34,36 includes a handle 38 which is used by an operator to pull a desired drawer out of the cabinet 22 to enable placement or removal of catch cups 28. In FIG. 2, the bottom drawer 36 is depicted partially extended out of the cabinet 22 and shows catch cups 28 positioned within the bottom drawer 36.

In addition, the cabinet 22 includes first 40 and second 42 compartments positioned adjacent to the opening 26. Inner 44 and outer 46 sliding doors are slidably affixed to edges 48 of the opening 26. The inner 44 and outer 46 doors serve to provide access to either the first 40 or second 42 compartment. In addition, the cabinet 22 is supported by wheels 50 and includes a handle 52 which may be used by the operator to move the cart 20.

Figure 3:
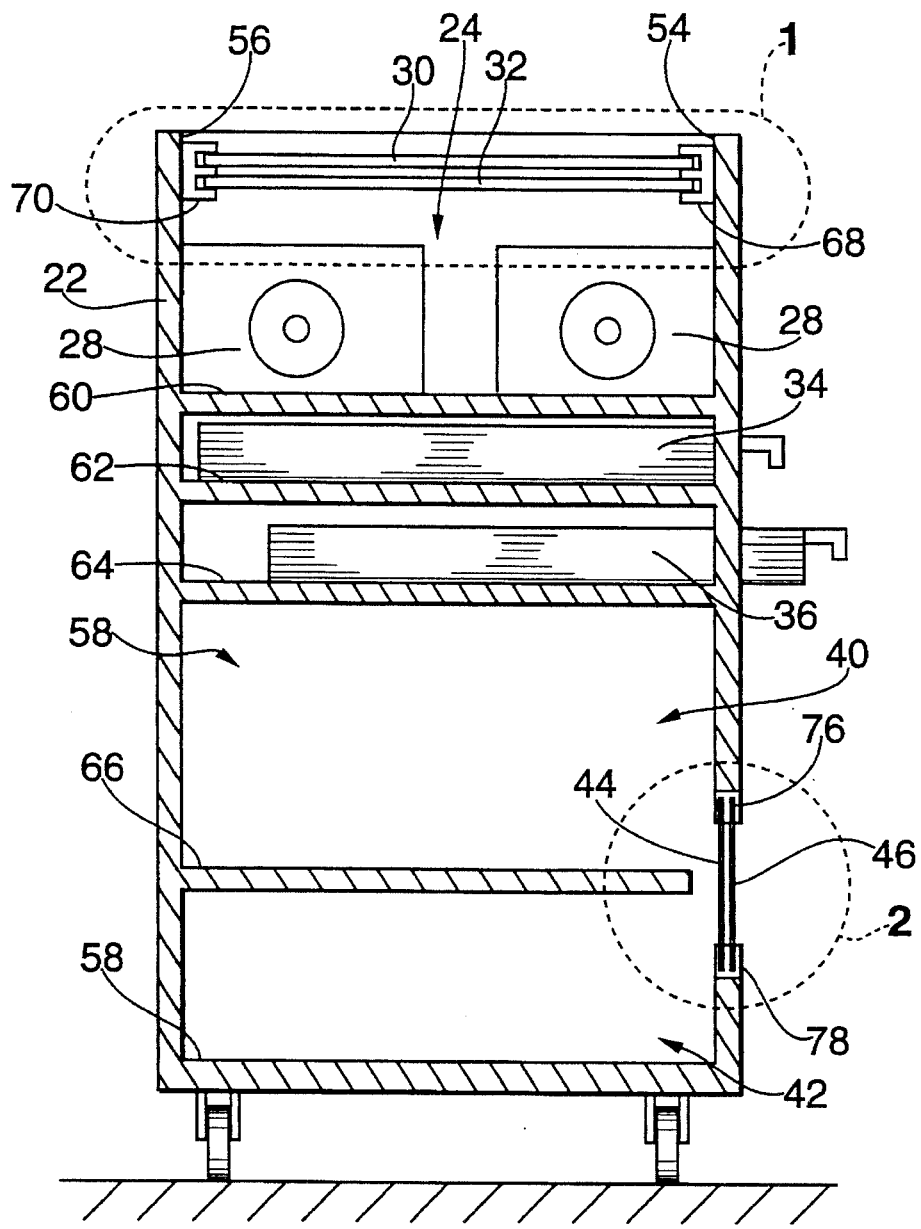
FIG. 3 is a view along section line 3—3 of FIG. 2.

Referring to FIG. 3, a cross sectional view of the cabinet 22 along section line 3—3 of FIG. 2 is shown. The cabinet 22 includes front 54 and rear 56 internal walls and a floor shelf 58 extending horizontally between the front 54 and rear 56 walls to form a cavity 58. In addition, top 60, upper 62 and lower 64 drawer and bottom 66 shelves extend horizontally within the cavity 58 between the front 54 and rear 56 walls. As such, the top 60, upper 62 and lower 64 drawer and bottom 66 shelves each limit the spread of particles and other contamination between the top compartment 24, the upper 34 and lower 36 drawers, first compartment 40 and second compartment 42. The cabinet 22 and the shelves 60,62,64,66 may be of a unistructural design and fabricated from a suitable material such as polypropylene to further limit the possibility of particle contamination. In addition, internal walls of the cabinet 22 may be lined with stainless steel. Furthermore, the drawers 34,36 are fabricated from a suitable material such as stainless steel and are removable from the cabinet 22 to enable immersion of the drawers 34,36 and contaminated catch cups 28 in a solution suitable for cleaning excess photoresist such as acetone or xylene.

Figure 4:
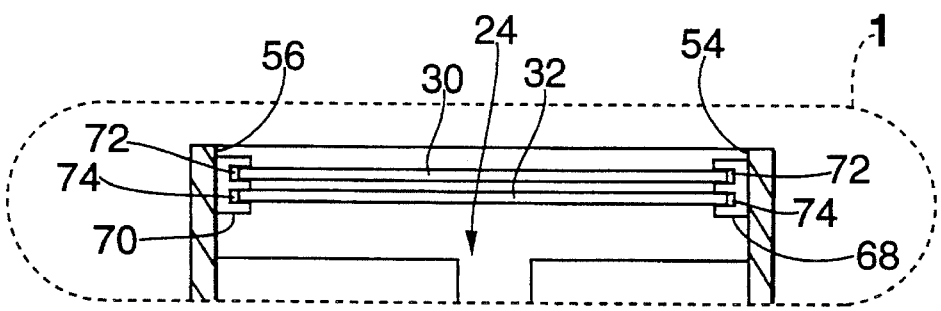
FIG. 4 is an enlarged view of section 1 of FIG. 3 and illustrates the upper and lower tracks.

The top shelf 60 is positioned near a top section of the cabinet 22 and to form the top compartment 24. Clean catch cups 28 are stored on the top shelf 60. Front 68 and rear 70 track assemblies are positioned above the top compartment 24. Referring to FIG. 4, an enlarged view of section 1 of FIG. 3 is shown which depicts the front 68 and rear 70 track assemblies in detail. The front 68 and rear 70 track assemblies each include substantially U-shaped upper 72 and lower 74 guides each having an open end. The front 68 and rear 70 track assemblies are each affixed to the front 54 and rear 56 walls, respectively such that the open ends face each other. The upper 30 and lower 32 doors are slidably affixed between the upper 72 and lower 74 guides, respectively. As such, the upper 30 and lower 32 doors are movable in a horizontal plane.

Referring back to FIG. 3, the upper 62 and lower 64 drawer shelves are spaced apart and are positioned underneath the top compartment 24. The upper 62 and lower 64 drawer shelves serve to support the upper 34 and lower 36 drawers, respectively. Each drawer 34,36 is adapted to slide on its respective drawer 62,64 shelf in a horizontal direction out of the cabinet 22 in order to provide access to the drawer and to slide in a horizontal direction into the cabinet 22 for storage of contaminated catch cups 28. It is noted that photoresist emits odors which are offensive to many operators. As such, when the upper 34 and lower 36 drawers are positioned within the cabinet 22, an operator is not substantially exposed to offensive odors emitted by the photoresist and worker productivity is not lost.

Figure 5:
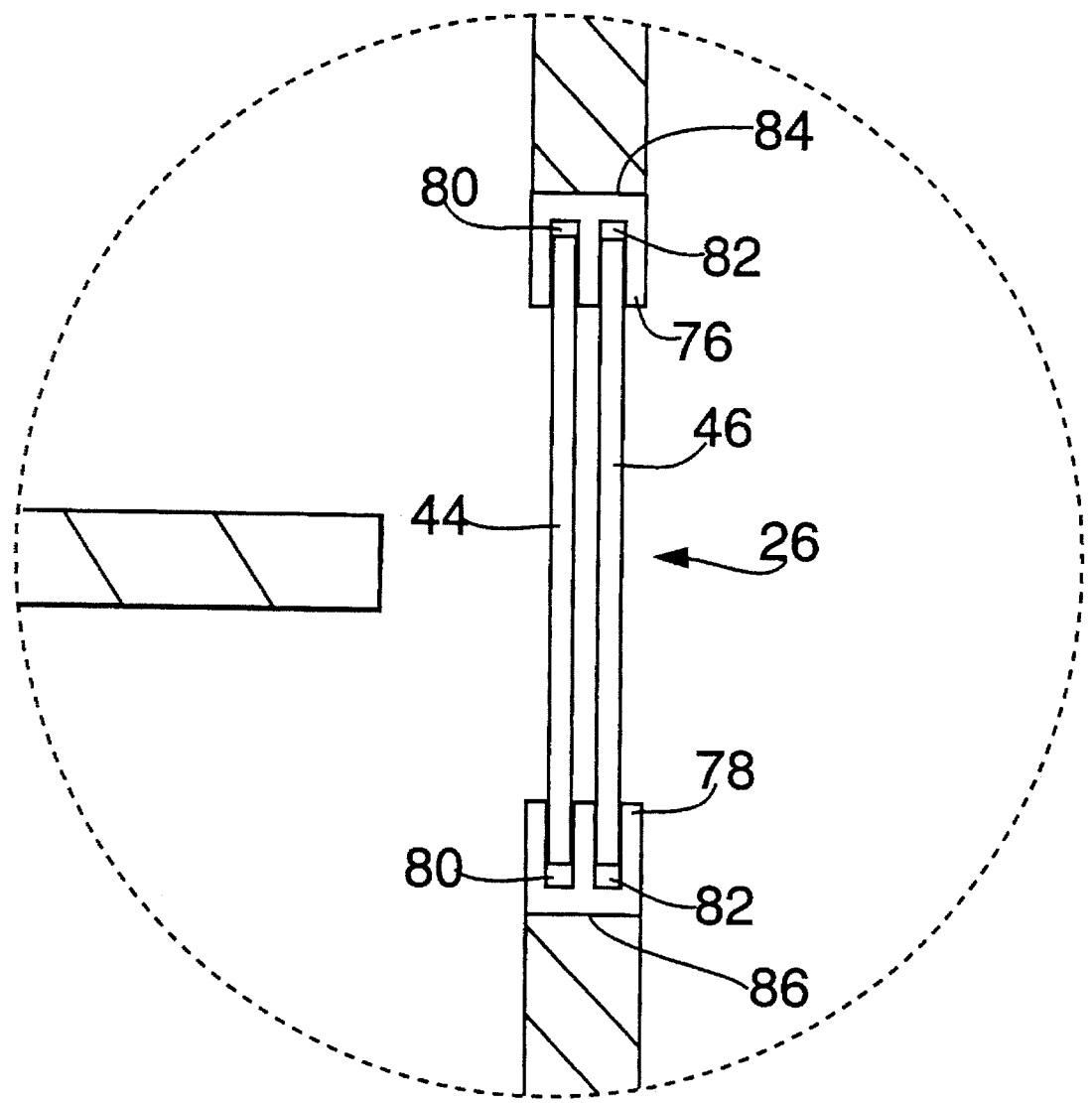
FIG. 5 is an enlarged view of balloon section 2 of FIG. 3 and illustrates the inner and outer tracks.

The bottom shelf 66 is positioned beneath the lower drawer shelf 64 and above the floor shelf 58 thus forming the first 40 and second 42 compartments. The opening 26 is located adjacent to the first 40 and second 42 compartments and provides access to the first 40 and second 42 compartments which may be used for general storage. Upper 76 and lower 78 tracks are positioned within the opening. Referring to FIG. 5, an enlarged view of balloon section 2 is shown which illustrates the upper 76 and lower 78 tracks in detail. The upper 76 and lower 78 tracks each include substantially U-shaped inner 80 and outer 82 guides each having an open end. The upper 76 and lower 78 tracks are affixed to upper 84 and lower 86 edges of the opening 26, respectively, such that the open ends face each other. The inner 44 and outer 46 doors are slidably affixed between the inner 80 and outer 82 guides, respectively. As such, the inner 44 and outer 46 doors are movable in a vertical plane.

Figure 6:
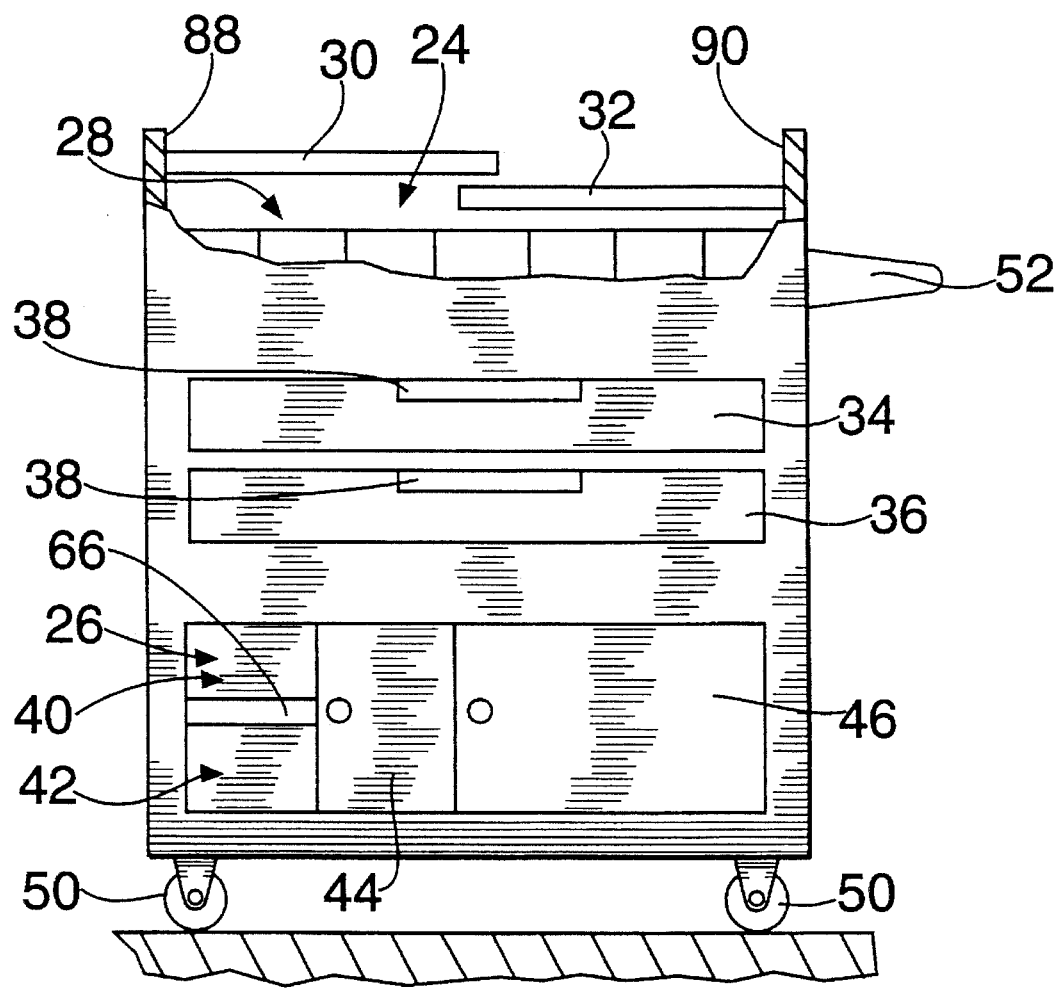
FIG. 6 is a view of the cabinet along section line 6—6 of FIG. 3.

Referring to FIG. 6, a view of the cabinet along view line 6—6 is shown. In FIG. 6, an upper portion of the cabinet 22 is depicted as a partial cross section without the front track 68 and shows the upper 30 and lower 32 doors in the closed position. The cabinet 22 further includes left 88 and right 90 internal walls. In the closed position, the upper door 30 is slid in a leftward direction until contact is made with the left wall 88 and the lower door 32 is slid in a rightward direction until contact is made with the right wall 90 such that all of the catch cups 28 are covered by both the upper 30 and lower 32 doors. In accordance with the present invention, this substantially protects the catch cups 28 from contamination.

Alternatively, either the upper 30 or lower 32 door may be slid into an open position independently of each other to partially uncover the top compartment 24. In order to open the upper door 30, the operator slides the upper door 30 in a rightward direction away from left wall 88. In order to open the lower door 32, the operator slides the lower door in a leftward direction away from the right wall 80. This simultaneously provides access to clean catch cups 28 positioned underneath a door which has been opened and substantially protects catch cups 28 which are positioned underneath a door in the closed position.

The sliding movement of the upper 30 and lower 32 doors generates negligible air turbulence as the upper 30 and lower 32 doors are opened or closed. As such, a relatively small amount of particles is displaced as the upper 30 and lower 32 doors are opened or closed. This is preferable to using a hinged door, which tends to "fan" the area surrounding the catch cups 28 as the door is opened or closed. This creates a significant amount of air turbulence, thus displacing substantially more particles which are then deposited on the catch cups 28 than the amount of particles displaced by movement of the upper 30 and lower 32 doors.

Similarly, either the inner 44 or outer 46 door may be slid in a vertical plane to a closed position against respective edges of the opening 26 such that the first 40 and second 42 compartments are covered by the inner 44 and outer 46 doors. Alternatively, either the inner 44 and outer 46 doors may be slid to an open position wherein the first 40 and second 42 compartments are partially uncovered, thus enabling access to the first 42 and second 46 compartments.

Figure 7:
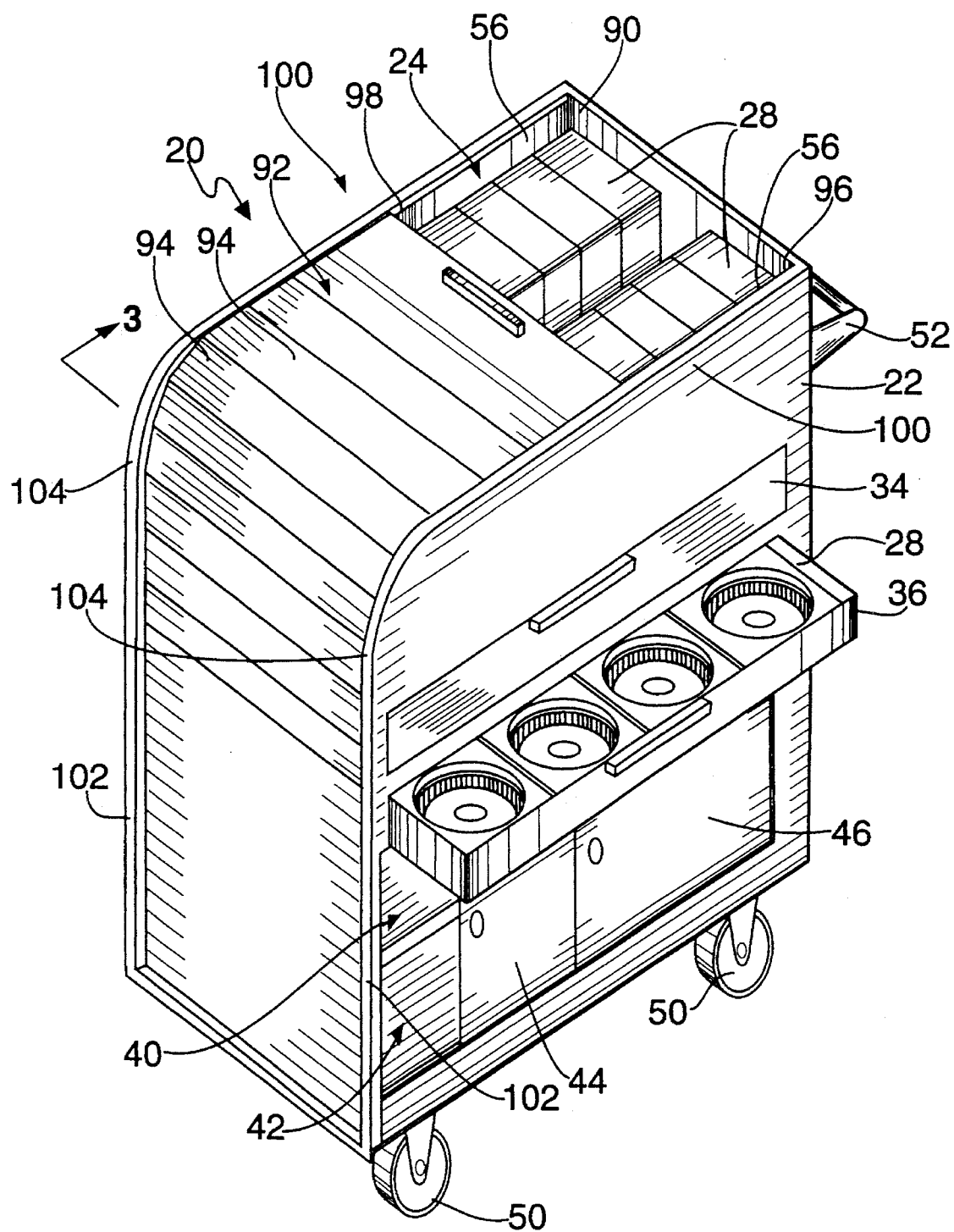
FIG. 7 is an alternate embodiment of the present invention.

Referring to FIG. 7, an alternate embodiment of the cart 20 is shown. In this embodiment, the top compartment 24 is covered by a compartment cover 92. The cover 92 includes a plurality of hinged slats 94 which enable the cover 92 to be flexible. In addition, the cabinet 22 includes front 96 and rear 98 channels which are affixed to front 54 and rear 56 walls, respectively. The front 96 and rear 98 channels each include a horizontal section 100 which extends across the top of the cabinet 22 and a vertical section 102 which extends down a left side of the cabinet 22. The horizontal 100 and vertical 102 sections are connected by a curved section 104. The cover 92 is slidably affixed within the channels 96,98 and is of a sufficient length to cover the top compartment 24. As such, the cover is movable through the horizontal 100, curved 104 and vertical 102 sections. A user is then able to cover the top compartment 24 and thus the catch cups 28 by moving the cover 92 in a rightward direction until the cover 92 contacts the right wall 90. Alternatively, the user may then uncover the top compartment 24 to provide access to the catch cups 28 by moving the cover 92 in a leftward direction. The sliding movement of the cover 92 generates negligible air turbulence and causes the displacement of a relatively small amount of particles. As previously described, this is preferable to using a hinged door, which tends to "fan" the area surrounding the catch cups 28 as the door is opened or closed. This creates a significant amount of air turbulence, thus displacing substantially more particles which are then deposited on the catch cups 28 than the amount of particles displaced by movement of the cover 92.

Thus it is apparent that in accordance with the present invention, an apparatus that fully satisfies the objectives, aims and advantages is set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A cart for maintaining items used in a cleanroom at a predetermined cleanliness level, comprising:

a cabinet having an internal cavity and opposed first and second internal walls;

a shelf affixed horizontally within said cavity between said first and second walls to form top and lower compartments within said cabinet;

a lower horizontal track affixed to said cabinet above said top compartment;

a lower door slidably affixed within said lower track;

an upper horizontal track affixed to said cabinet above said lower track;

an upper door slidably affixed within said upper track, wherein said upper and lower doors are movable in a horizontal direction above said top compartment and said top compartment is substantially isolated from contamination when said upper door contacts said first wall and said lower door contacts said second wall or when said upper door contacts said second wall and said lower door contacts said first wall;

top and bottom drawers slidably affixed within said cabinet;

rotatable wheels for supporting said cabinet and to facilitate movement of said cabinet; and an opening adjacent to said lower compartment having an outer track and an inner track, said outer track including an outer door slidably affixed therein and said inner track including an inner door slidably affixed therein wherein said outer and inner doors are moveable to provide access to said lower compartment and to close said lower compartment.

2. The cart according to claim 1, wherein said cabinet, said shelf and said upper and lower tracks are fabricated from polypropylene.

* * * * *